(12) United States Patent
Schultz

(10) Patent No.: US 10,068,794 B2
(45) Date of Patent: Sep. 4, 2018

(54) GATE ALL AROUND DEVICE ARCHITECTURE WITH HYBRID WAFER BOND TECHNIQUE

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/421,157

(22) Filed: Jan. 31, 2017

(65) Prior Publication Data

US 2018/0218938 A1    Aug. 2, 2018

(51) Int. Cl.
*H01L 21/336*    (2006.01)
*H01L 21/762*    (2006.01)
(Continued)

(52) U.S. Cl.
CPC .. *H01L 21/76251* (2013.01); *H01L 21/02532* (2013.01); *H01L 21/02603* (2013.01); *H01L 21/3065* (2013.01); *H01L 29/0673* (2013.01); *H01L 29/42392* (2013.01); *H01L 29/66742* (2013.01); *H01L 29/78651* (2013.01); *H01L 29/78684* (2013.01); *H01L 29/78696* (2013.01)

(58) Field of Classification Search
CPC ......... H01L 21/02381; H01L 21/02532; H01L 21/02603; H01L 29/7856; H01L 21/76251; H01L 21/02606; H01L 29/0665; H01L 29/66439; H01L 29/42392
See application file for complete search history.

(56) References Cited

U.S. PATENT DOCUMENTS 9,425,318 B1    8/2016  Hoentschel et al.
9,704,995 B1 *  7/2017  Schultz .............. H01L 29/7856
(Continued)

FOREIGN PATENT DOCUMENTS

WO    2014/051769 A1    4/2014

OTHER PUBLICATIONS

International Search Report and Written Opinion in International Application No. PCT/US2017/052339, dated Dec. 6, 2017, 15 pages.

(Continued)

*Primary Examiner* — Khiem D Nguyen
(74) *Attorney, Agent, or Firm* — Meyertons Hood Kivlin Kowert and Goetzel PC; Rory D. Rankin

(57) ABSTRACT

A system and method for fabricating non-planar devices while managing semiconductor processing yield and cost are described. A semiconductor device fabrication process forms a stack of alternating semiconductor layers. A trench is etched and filled with at least an oxide layer with a length at least that of a device channel length while being bounded by sites for a source region and a drain region. The process places a second silicon substrate on top of both the oxide layer in the trench and the top-most semiconducting layer of the stack. The two surfaces making contact by wafer bonding use the same type of semiconducting layer. The device is flipped such that the first substrate and the stack are on top of the second substrate. The process forms nanowires of a gate region from the stack in the top first substrate.

16 Claims, 8 Drawing Sheets

(51) Int. Cl.
*H01L 29/66* (2006.01)
*H01L 21/3065* (2006.01)
*H01L 21/02* (2006.01)
*H01L 29/06* (2006.01)
*H01L 29/423* (2006.01)
*H01L 29/786* (2006.01)

(56) References Cited

U.S. PATENT DOCUMENTS

| | | |
|---|---|---|
| 2006/0216897 A1* | 9/2006 | Lee .................. B82Y 10/00 438/282 |
| 2012/0007051 A1 | 1/2012 | Bangsaruntip et al. |
| 2012/0138886 A1* | 6/2012 | Kuhn .................. B82Y 10/00 257/9 |
| 2014/0183643 A1 | 7/2014 | Colinge et al. |
| 2015/0144880 A1* | 5/2015 | Rachmady ........ H01L 29/42392 257/24 |
| 2015/0295036 A1 | 10/2015 | Hong |
| 2015/0372104 A1 | 12/2015 | Liu et al. |

OTHER PUBLICATIONS

Dargis et al., "Epitaxial Growth and Properties of Silicon on Crystalline Rare-Earth-Metal Oxide for SOI-Applications", Materials Science, May 1, 2009, pp. 11-15, vol. 15, No. 1.

* cited by examiner

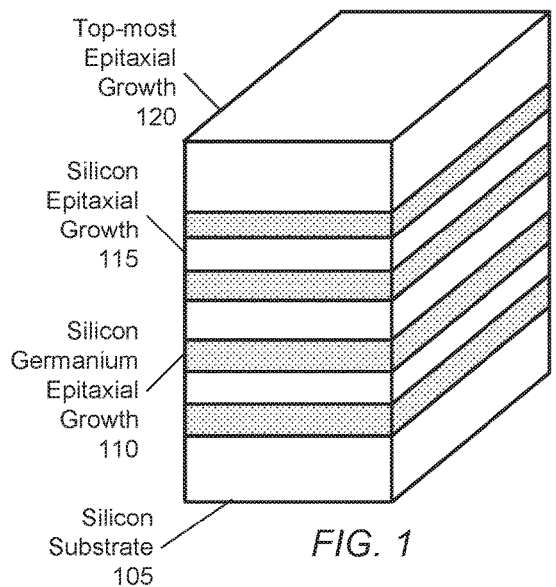
FIG. 1
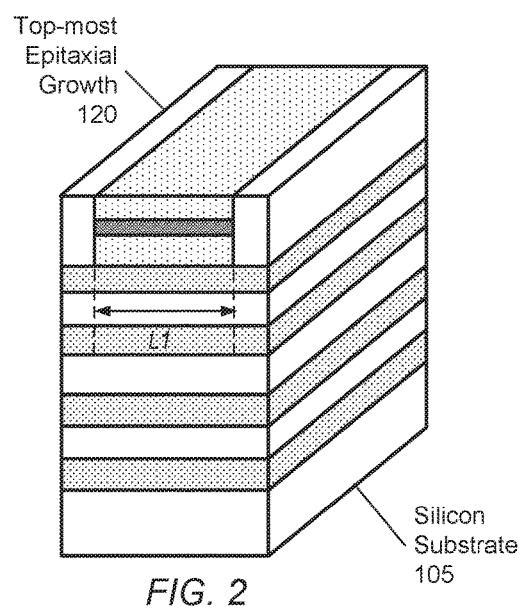
FIG. 2
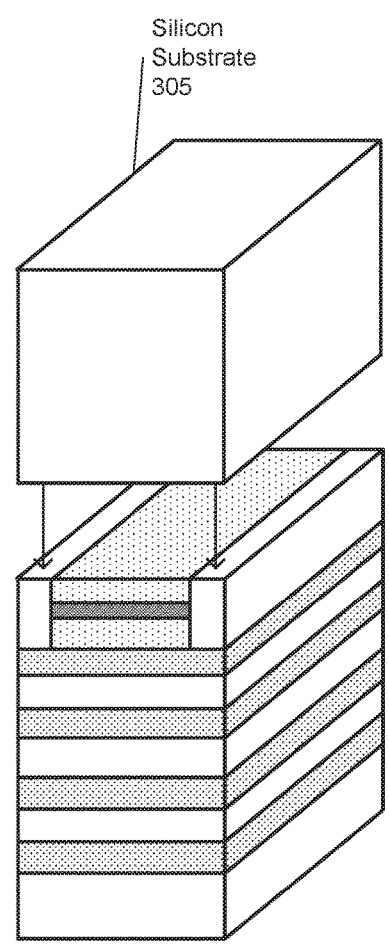
FIG. 3
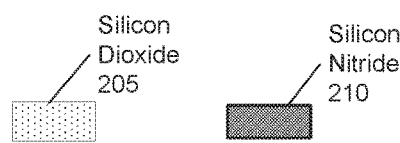

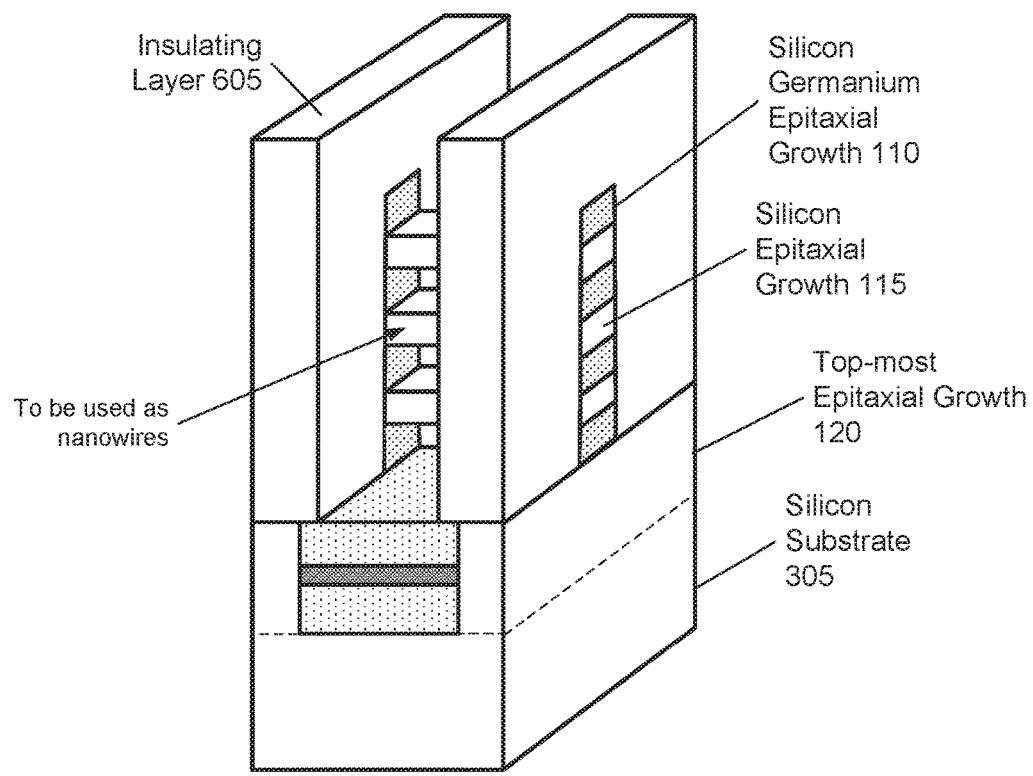
FIG. 6
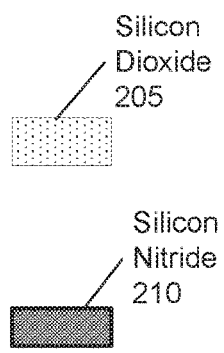

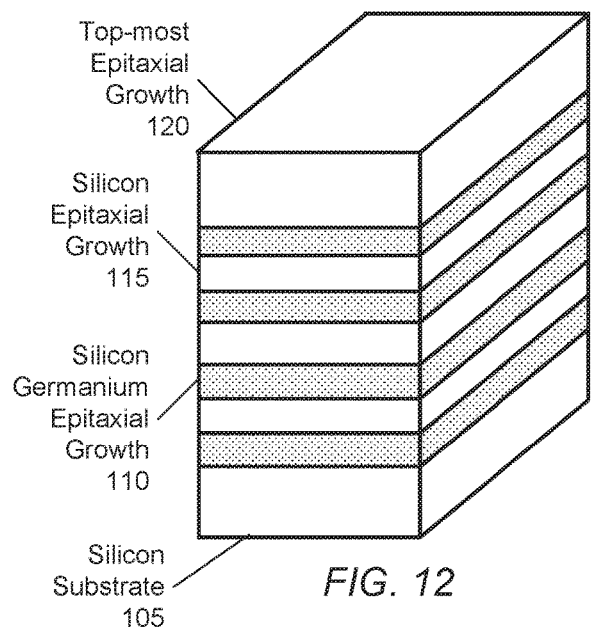
FIG. 12
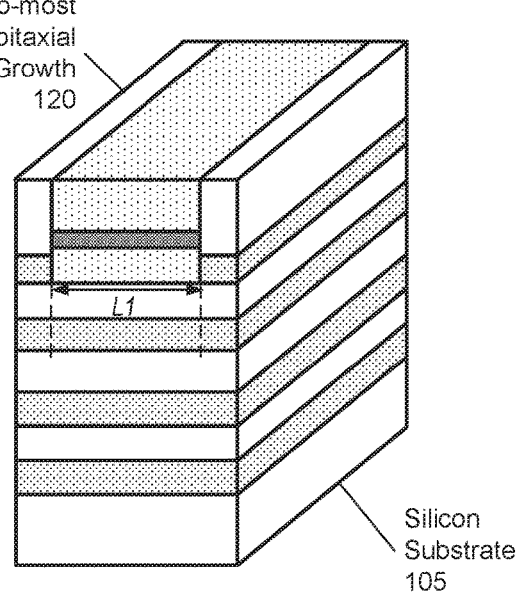
FIG. 13
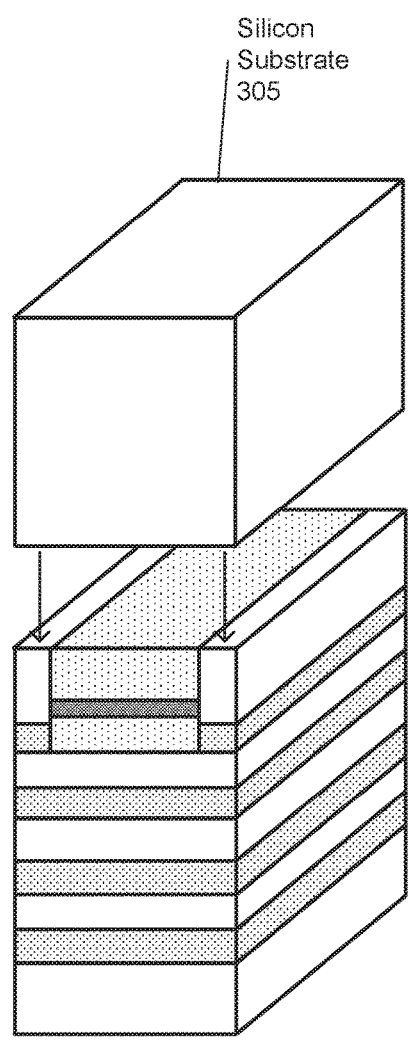
FIG. 14
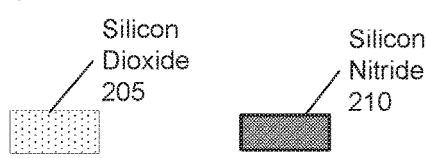

GATE ALL AROUND DEVICE ARCHITECTURE WITH HYBRID WAFER BOND TECHNIQUE

BACKGROUND

Description of the Relevant Art

For multiple decades, planar transistors (devices) have been fabricated for use in integrated circuits. However, as the transistor dimensions decrease, the short channel effects increase. One example of the short channel effects is leakage current. Power consumption increases with leakage current. Other examples of short channel effects are latchup effects, drain-induced barrier lowering (DIBL), punchthrough, performance dependency on temperature, impact ionization, and parasitic capacitance to the silicon substrate and to the wells used for the source and drain regions.

In some embodiments, silicon on insulator (SOI) technology is used in place of bulk complementary metal-oxide-semiconductor (CMOS) technology for reducing short channel effects. However, the heat sourced by the encapsulated transistors in a SOI wafer is unable to transport to the back of the silicon substrate. Further manufacturing steps are used to create a heat sink. For example, after the transistor is fabricated, multiple plugs are formed that extend through the thickness of the bulk silicon layer to the barrier oxide layer. The multiple plugs allow heat generated by device operation to sink through the bulk silicon layer to the back surface of the wafer. However, the multiple plugs increase manufacturing costs and can include retooling manufacturing components.

Non-planar transistors are a recent development in semiconductor processing for reducing short channel effects. Tri-gate transistors, Fin field effect transistors (FETs) and gate all around (GAA) transistors are examples of non-planar transistors. However, fabrication requirements of these devices can limit manufacturability. Additionally, as transistor dimensions decrease, the parasitic leakage paths between the source region and the drain region still become problematic.

When creating non-planar transistors, in some embodiments, two substrates are put in contact with one another by one of a variety of techniques for wafer bonding. In some embodiments, the surfaces of the two substrates making contact use different semiconductor conduction layers. The wafer bonding technique in combination with the different conduction layers increases lattice dislocations and processing defects. In addition, in various embodiments, each of the two substrates is manufactured with semiconductor processing. The processing on each of the two substrates also increases processing defects as well as manufacturing costs. Further, the distance between the wafer bond interface and the active devices is relatively small. The associated stress and stain also increases lattice dislocations and processing defects.

In view of the above, efficient methods and systems for fabricating non-planar devices while managing semiconductor processing yield and cost are desired.

BRIEF DESCRIPTION OF THE DRAWINGS

FIG. 1 is a generalized diagram of a cross-sectional view of a device being fabricated.

FIG. 2 is a generalized diagram of another cross-sectional view of a device being fabricated.

FIG. 3 is a generalized diagram of another cross-sectional view of a device being fabricated.

FIG. 6 is a generalized diagram of another cross-sectional view of a device being fabricated.

FIG. 12 is a generalized diagram of another cross-sectional view of a device being fabricated.

FIG. 13 is a generalized diagram of another cross-sectional view of a device being fabricated.

FIG. 14 is a generalized diagram of another cross-sectional view of a device being fabricated.

Figure 4:
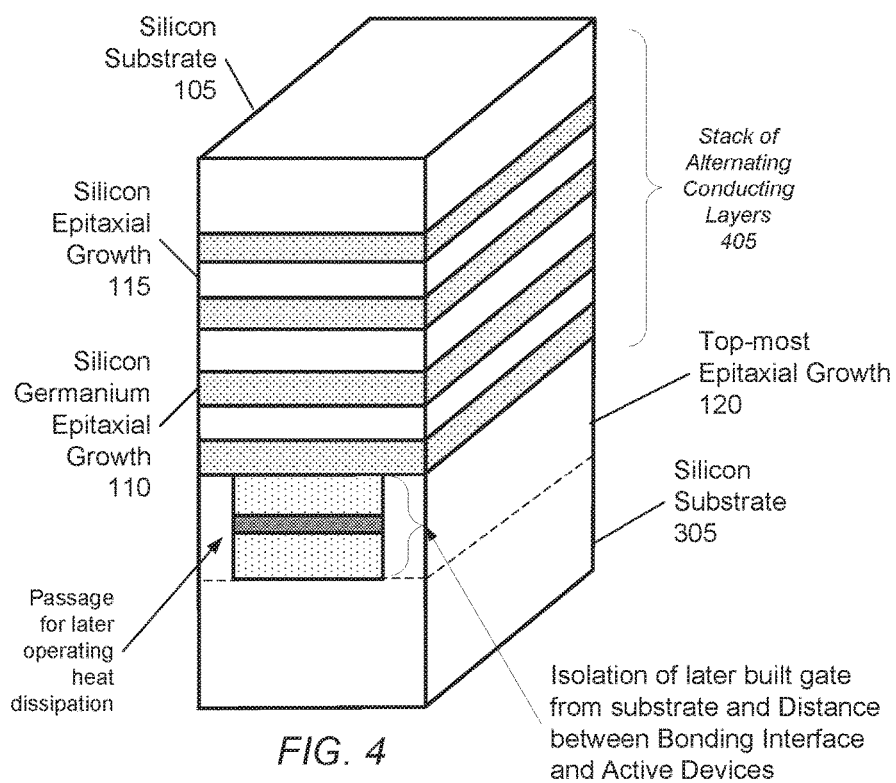
FIG. 4 is a generalized diagram of another cross-sectional view of a device being fabricated.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating non-planar devices while managing semiconductor processing yield and cost are contemplated. In various embodiments, a semiconductor device fabrication process forms a non-planar device, or transistor, where the body of the device is insulated from the silicon substrate, but the source and drain regions are not insulated from the silicon substrate. On a first substrate of two substrates, the semiconductor device fabrication process forms a stack of alternating semiconductor layers to be used as nanowires in a gate region. In various embodiments, the alternating semiconductor layers are silicon layers and silicon germanium layers.

The process etches a trench in at least a top-most semiconducting layer of the stack of the first substrate. The trench has a length as long as at least a channel length while being bounded by a site for a source region and a site for a drain region. In other words, the source and drain regions are not included in the trench. At least one relatively thick silicon dioxide layer is formed in the trench. Therefore, the process builds a local silicon on insulator (SOI) which insulates the body of the device from the silicon substrate while not insulating the source and drain regions from the silicon substrate. As the filled trench does not run underneath sites for the source and drain regions, generated heat by the later operating device is transported through the silicon substrate to the back of the wafer.

The process places a second silicon substrate on top of both the oxide layer in the trench and the top-most semiconducting layer of the stack of the first substrate. In various embodiments, the surfaces of the two substrates making contact use the same type of semiconducting layer. For example, each of the surfaces of the two substrates is a silicon layer. An amount of processing defects is reduced as a result when the process performs wafer bonding for the two substrates. In various embodiments, there is no semiconductor processing performed on the second substrate. Therefore, the risk of lattice dislocations and processing defects is reduced. Afterward, the device is flipped such that the first substrate and the stack are on top of the second substrate. The semiconductor device fabrication process continues by forming nanowires of a gate region from the stack of silicon layers or silicon germanium layers.

In the upcoming description of FIGS. 1-16, the fabrication steps for a non-planar semiconductor device which also manages processing yield and cost are described. Turning to FIG. 1, a generalized block diagram of a cross-sectional view of a portion of a semiconductor device being fabricated is shown. Here, alternating conduction layers are grown on top of the silicon substrate 105. In some embodiments, a silicon germanium semiconducting epitaxial growth layer 110 is grown first followed by a silicon semiconducting epitaxial growth layer 115, and then the layers 110 and 115 alternate. In other embodiments, the stack additionally includes a gallium arsenide semiconducting layer. Other semiconducting layers for the stack are possible and contemplated. In the embodiment shown, the top-most epitaxial growth layer 120 is a silicon semiconducting epitaxial growth layer.

The silicon germanium epitaxial growth 105 is grown by an elevated temperature two-step process with a hydrogen anneal where a thin low temperature germanium first buffer layer is grown followed by a thicker high temperature germanium layer grown on top. The silicon epitaxial growth 115 is grown by using vapor-phase epitaxy (VPE), which is a modification of chemical vapor deposition (CVD, or a molecular-beam and liquid-phase epitaxy (MBE and LPE) are used. The alternating semiconductor layers 110 and 115 are grown to later form nanowires for the gate region.

Referring to FIG. 2, a generalized block diagram of another cross-sectional view of a portion of a semiconductor device being fabricated is shown. As shown, the top-most semiconducting layer 120, which is a silicon epitaxial growth layer 115, has a trench etched into it. In various embodiments, a dry etch process is used to etch the trench. Portions of the silicon epitaxial growth layer 115 are not protected by a mask layer are immersed in plasma, which is a reactive gas. The unprotected layer is removed by chemical reactions and/or ion bombardment. The reaction products are carried away in the gas stream.

Plasma etching processes can operate in one of multiple modes by adjusting the parameters of the etching process. Some plasma etching processes operate with a pressure between 0.1 torr and 5 torr. In various embodiments, the source gas for the plasma contains chlorine or fluorine. For example, carbon tetrachloride (CCl4) is used to etch silicon and aluminum. Trifluoromethane (CHF3) is used to etch silicon dioxide and silicon nitride. A source gas for plasma containing oxygen is used to oxidize ("ash") photoresist, which facilitates the removal of the photoresist.

The plasma etching process can be isotropic, i.e., exhibiting a lateral undercut rate on a patterned surface approximately the same as the downward etch rate. A plasma etching process which produces energetic neutrally charged free radicals that react at the surface of the unprotected layer such that the reactions occur from all angles on the unprotected layer is an isotropic process. A plasma etching process can also be anisotropic, i.e., exhibiting a smaller lateral undercut rate than the downward etch rate. An anisotropic plasma etching process is used in deep reactive ion etching.

Ion milling, or sputter etching processes, uses lower pressures, such as on the scale of 10 millipascals versus a hundred pascals of the above processes, and bombards the unprotected layer (not covered by the mask layer) with energetic ions of noble gases. Argon is typically used as the noble gas. The energetic ions knock atoms from the unprotected layer, such as the silicon epitaxial growth layer 115, by transferring momentum. The energetic ions react with the unprotected layer typically from a single direction, which causes the sputter etching process to be anisotropic. In various embodiments, sputter etching processes include relatively poor selectivity.

A reactive-ion etching (ME) process generates a plasma by an electromagnetic field under a relatively low pressure to remove material deposited on wafers. A deep reactive-ion etching (DRIE) process is a relatively high anisotropic etch process used to create deep penetration in the unprotected layer for steep-sided holes and trenches.

In addition to selecting the etching process, each of the masking material used to protect portions of the layer being etched, the etch rate and the etching time are selected to create the trench in the silicon epitaxial growth layer 115 of FIG. 2 with a length at least as long as a channel length of the semiconductor device being fabricated. The length of the trench is shown as "L1." The length of the trench, L1, is also bounded by a site for a source region and a site for a drain region to be added in a later fabrication step. In other words, the source and drain regions are not included in the trench. Therefore, the length of the trench, L1, does not span the length of the semiconductor device being fabricated. Therefore, the semiconductor device fabrication process is building a local silicon on insulator (SOI) which insulates the body of the device from the silicon substrate while not insulating the source and drain regions from the silicon substrate.

Following the above, a silicon dioxide (SiO2) layer 205 of a controlled thickness is formed. In various embodiments, a plasma-enhanced chemical vapor deposition (PECVD) process is used to deposit a thin film of silicon dioxide from a gas state (vapor) to a solid state on the silicon epitaxial growth layer 115. The PECVD process introduces reactant gases between a grounded electrode and a parallel radio frequency (RF) energized electrode. The capacitive coupling between the electrodes excites the reactant gases into a plasma, which induces a chemical reaction and results in the reaction product being deposited on the silicon epitaxial growth layer 115. The silicon dioxide 205 can be deposited using a combination of gasses such as dichlorosilane or silane with oxygen precursors, such as oxygen and nitrous oxide, typically at pressures from a few millitorr to a few torr. The thickness of the silicon dioxide layer 205 is relatively thick. For example, the thickness of the silicon dioxide layer 205 is at least an order of magnitude greater than a thickness of a thin gate silicon dioxide layer formed in a later processing step for depositing silicon dioxide on nanowires.

After the silicon dioxide layer 205 is deposited, a chemical mechanical planarization (CMP) step is used to remove unwanted silicon dioxide and to polish the remaining silicon dioxide layer 205 on the silicon wafer. The CMP step achieves a near-perfect flat and smooth surface upon which further layers of integrated circuitry are built. Following this, the silicon dioxide layer 205 is etched to the desired thickness. After the etching, a silicon nitride (SiNx) layer 210 is deposited on the silicon dioxide layer 205 in the trench and the top-most semiconducting layer 120, which is a silicon epitaxial growth layer 115.

The chemical and electrical properties of amorphous hydrogenated silicon nitride (SiNx) makes this material a good candidate for an insulating layer in integrated circuits. In some embodiments, the silicon nitride layer 210 is formed from silane (SiH4) and ammonia (NH3) with the plasma enhanced chemical vapor deposition (PECVD) technique. In other embodiments, the silicon nitride layer 210 is formed with the low pressure chemical vapor deposition (LPCVD) technique.

Subsequent to the above, a CMP step is used to remove unwanted silicon nitride from on top of the top-most semiconducting layer 120, which is a silicon epitaxial growth layer 115, and to polish the silicon nitride. The silicon nitride layer 210 is then etched with fluorine-containing mixtures to remove it from the top-most semiconducting layer 120 and from within the trench to the desired thickness, and then another silicon dioxide layer is formed. Similar to the first silicon dioxide layer below the silicon nitride layer 210, the second silicon dioxide layer above the silicon nitride layer 210 is deposited, a CMP step removes unwanted silicon dioxide and polishes the remaining silicon dioxide layer on the silicon wafer, and it is etched to the desired thickness. The multiple layers of silicon dioxide, silicon nitride and silicon dioxide provide an insulating layer for the non-planar semiconductor device being fabricated. In other embodiments, a silicon nitride layer is not used and the trench is only filled with silicon dioxide to provide the insulating layer for the non-planar semiconductor device being fabricated.

Turning now to FIG. 3, a generalized block diagram of another cross-sectional view of a portion of a semiconductor device being fabricated is shown. Here, a second silicon substrate 305 is bonded to the top of the silicon dioxide layer 205 and the top-most semiconducting layer 120, which is a silicon epitaxial growth layer 115, of the stack on top of the first silicon substrate 105. The bonding is performed by any of a number of wafer to wafer bonding techniques. For example, in some embodiments, copper-based wafer bonding, which is also known as thermo-compression bonding, is used. With copper as the bonding medium, an electrical bond is established as a conductive path between the wafers. In addition, a mechanical bond is established for holding the wafers together. In other embodiments, oxide-oxide bonding, which is also known as molecular, fusion or direct wafer bonding, is used.

In various embodiments, the two bonding surfaces use the same type of semiconducting layer. As shown, the second silicon substrate 305 has a surface with a silicon semiconducting layer and the top-most semiconducting layer 120 is a silicon epitaxial growth layer 115. An amount of processing defects is reduced as a result when the process performs wafer bonding with two bonding surfaces using the same type of semiconducting layer. In various embodiments, there is no semiconductor processing performed on the second silicon substrate 305. Therefore, the risk of lattice dislocations and processing defects is further reduced. Afterward, the device being fabricated is flipped such that the silicon substrate 105 and the stack are on top of the silicon substrate 305 as shown in the upcoming description.

Turning now to FIG. 4, a generalized block diagram of another cross-sectional view of a portion of a semiconductor device being fabricated is shown. Here, the device being fabricated has been flipped such that the silicon substrate 105 and the stack are on top of the silicon substrate 305. The stack 405 of alternating semiconductor conduction layers are shown on top of the top-most semiconducting layer 120. A dashed line is used to show the bonding surface from the previous performed wafer bonding technique.

The trench is now upside down after the device being fabricated is flipped. The trench still includes a silicon dioxide layer 205, a silicon nitride layer 210 and another silicon dioxide layer 205. In some embodiments, each layer within the trench has a separate and different thickness. In other embodiments, multiple layers within the trench have a same thickness. The sum of the thicknesses of the three layers within the trench provide the distance between the wafer bond interface shown as the dashed line and the active devices being fabricated. The increased distance reduces the associated stress and stain from the wafer bonding technique, which also decreases lattice dislocations and processing defects.

As described earlier, the trench provides a local SOI for a gate to be later formed. In addition, passageways on either side of the trench allow heat that will later be generated by an operating device to sink through the top-most semiconducting layer 120, which is a silicon epitaxial growth layer 115, and the bulk silicon substrate 305 to the back surface of the wafer. In embodiments using copper-based wafer bonding, the generated heat also sinks through the copper bonding medium between the two wafers.

Figure 5:
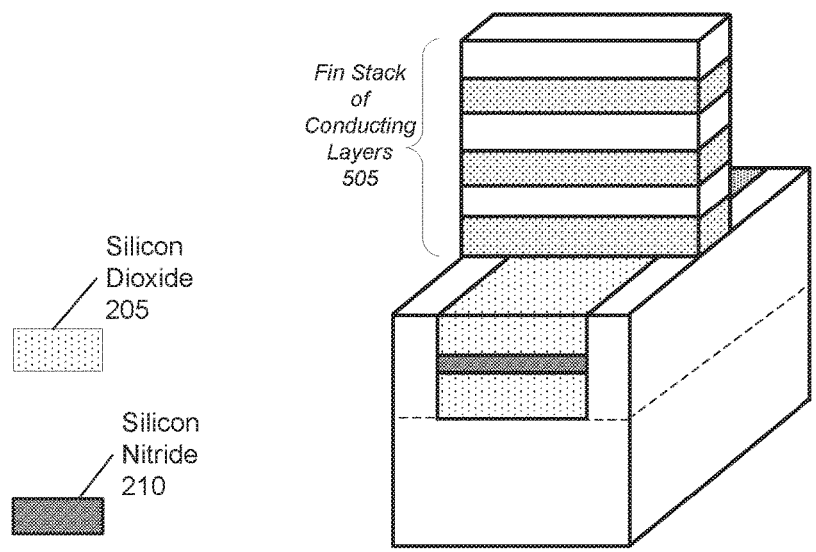
FIG. 5 is a generalized diagram of another cross-sectional view of a device being fabricated.

Referring now to FIG. 5, a generalized block diagram of another cross-sectional view of a portion of a semiconductor device being fabricated is shown. Here, a Fin stack 505 of alternating semiconducting layers is created from the previous stack 405 of alternating semiconducting layers. Silicon Fins with a relatively small pitch but with dimensions suitable for field effect transistors are formed by multiple processes. In various embodiments, the silicon Fins are formed with a sidewall image transfer (SIT) process. In other embodiments, the silicon Fins are formed with extreme ultraviolet (EUV) lithography. In yet other embodiments, the silicon Fins are formed by directed self-assembly (DSA) patterning via chemoepitaxy or self-aligned customization.

Turning now to FIG. 6, a generalized block diagram of another cross-sectional view of a portion of a semiconductor device being fabricated is shown. Here, an insulating layer 605 is deposited around the Fin pattern of alternating semiconducting layers 110 and 115. The insulating layer 605 includes one or more of silicon dioxide and silicon nitride. The insulation layer 605 is etched to expose the alternating conduction layers 110 and 115 in the gate region to be formed later. A given conduction layer of the layers 110 and 115 is selected to remain for forming the gate region. Afterward, any semiconducting layer of the layers 110 and 115 other than the selected layer is removed. For example, the silicon epitaxial growth layer 115 is chosen to remain. Therefore, a portion of the silicon germanium epitaxial growth layers 110 is removed from the alternating stack. The portion being removed has a length equal to at least the channel length.

Figure 7:
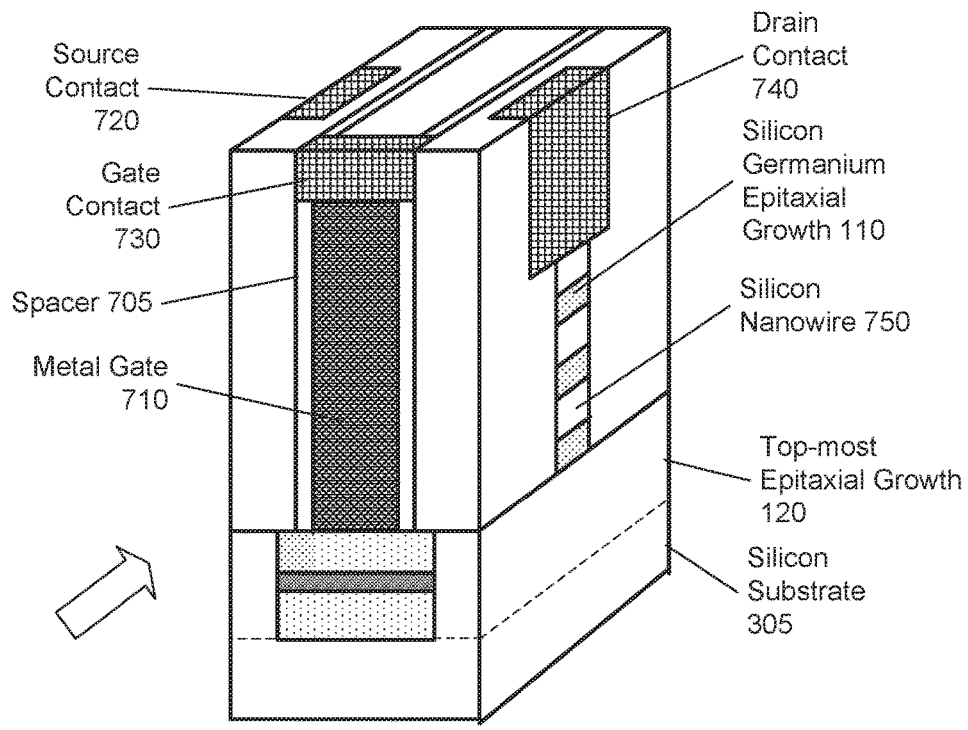
FIG. 7 is a generalized diagram of another cross-sectional view of a device being fabricated.

Referring now to FIG. 7, a generalized block diagram of another cross-sectional view of a portion of a semiconductor device being fabricated is shown. As shown, a spacer 705 is formed in the inner walls of the insulating layer 605 by being deposited and etched. In various embodiments, the spacer 705 includes silicon nitride. In other embodiments, the spacer 705 is a combination of silicon dioxide and silicon nitride. A relatively thin silicon dioxide layer is grown on the silicon epitaxial growth layers 115 to provide silicon nanowires 750 in the gate region. In some examples, the silicon nanowires 750 have a thickness of 5-7 nanometers, whereas the gate silicon dioxide layer (shell) has a thickness ranging from 1 nanometer to 10-15 angstroms. A dry oxidation processing step at an elevated temperature is used to form the relatively thin oxide shell on the silicon nanowires 750. After this, a high-k dielectric, such as hafnium oxide (HfO2), can be deposited on the oxide shell on the nanowires 750 using an atomic layer deposition (ALD). The high-k dielectric may also be referred to as a high-k film.

Gate metal material 710 has been deposited followed by CMP steps to polish the gate metal 710. In various embodiments, titanium nitride (TiN) is used for the gate metal 710. The gate metal 710 is provided around the nanowires. The stack of silicon dioxide layers 205 and the nitride layer 210 in the trench provides a local silicon on insulator (SOI) where the gate region is isolated from the silicon substrate 305. Therefore, the capacitive coupling between the gate region and the silicon substrate 305 is reduced. However, the local SOI does not span the length of the semiconductor device being fabricated as is done with typical SOI. Rather, the local SOI has the length L1 and is bounded by a site for a source region and a site for a drain region. Consequently, the semiconductor device (transistor) is not encapsulated by the local SOI and a passage exists on either side of the trench to allow heat generated by device operation to sink through the top-most semiconducting layer 120, which is a silicon epitaxial growth layer 115, and the bulk silicon substrate 305 to the back surface of the wafer.

As shown in FIGS. 6-7, a source contact 720 for the source region, a gate contact 730 and a drain contact 740 for the drain region are formed. In some embodiments, silicide contacts are formed at both ends of the silicon nanowires providing low resistive contacts 720 and 740 for the source region and the drain region. Between depositing the metal gate 710 and forming the contacts 720-740, the insulating layer 605 is etched away followed by the source region and the drain region are formed by an implantation process. Afterward, another insulating layer is deposited, but this time around the alternating portions of the conduction layers 110 and 115 outside of the silicon nitride spacers.

Figure 8:
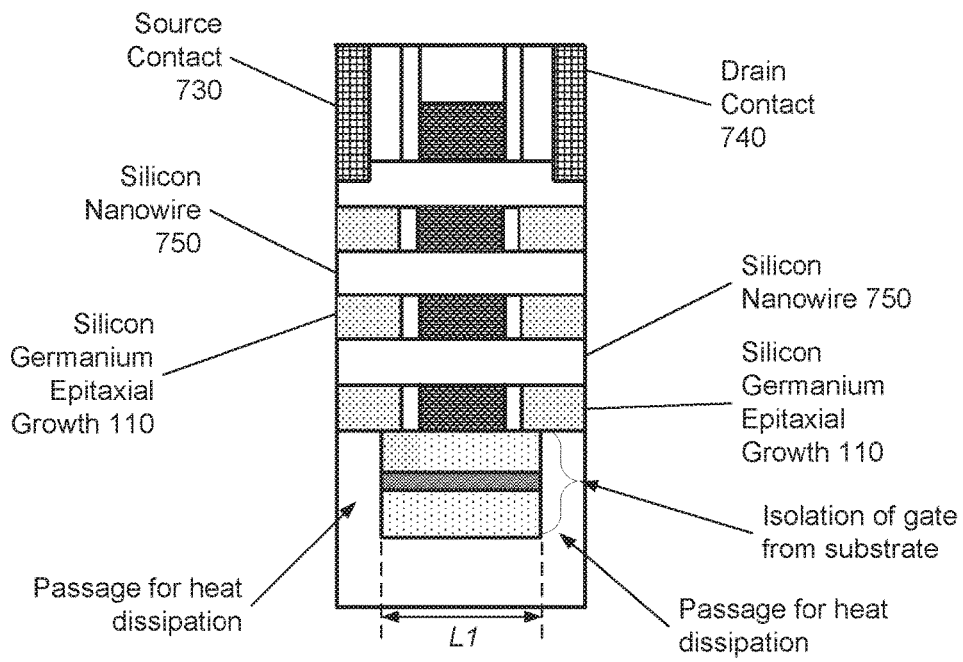
FIG. 8 is a generalized diagram of a cross-sectional view from the front of the semiconductor device being fabricated.

Turning now to FIG. 8, a generalized block diagram of a cross-sectional view from the front of the semiconductor device being fabricated is shown. As shown, the silicon nanowires 750 are shown horizontally between the source region and the drain region. The metal gate 710 is shown throughout the gate region and around the nanowires 750 to provide a gate all around GAA) semiconductor device. As described earlier, the stack of silicon dioxide layers and silicon nitride layer in the trench provides the local silicon on insulator (SOI) where the gate region is isolated from the silicon substrate 305. As the local SOI does not span the length of the semiconductor device being fabricated as is done with typical SOI, passages exist for dissipating heat generated by device operation.

It is noted that in some embodiments, the silicon germanium semiconducting layer 110 is selected to remain for building p-channel semiconductor devices. The silicon semiconducting layer 115 is selected to remain for building n-channel semiconductor devices. It is also noted that other materials may be used for the semiconducting layers. For example, gallium arsenide (GaAs) can be used for building n-channel semiconductor devices. In various embodiments, if the selected semiconducting layer to remain resides on top of the top-most semiconducting layer 120, then a trench is etched into the silicon dioxide layer for depositing gate material 710. Otherwise, no additional trench is used.

Figure 9:
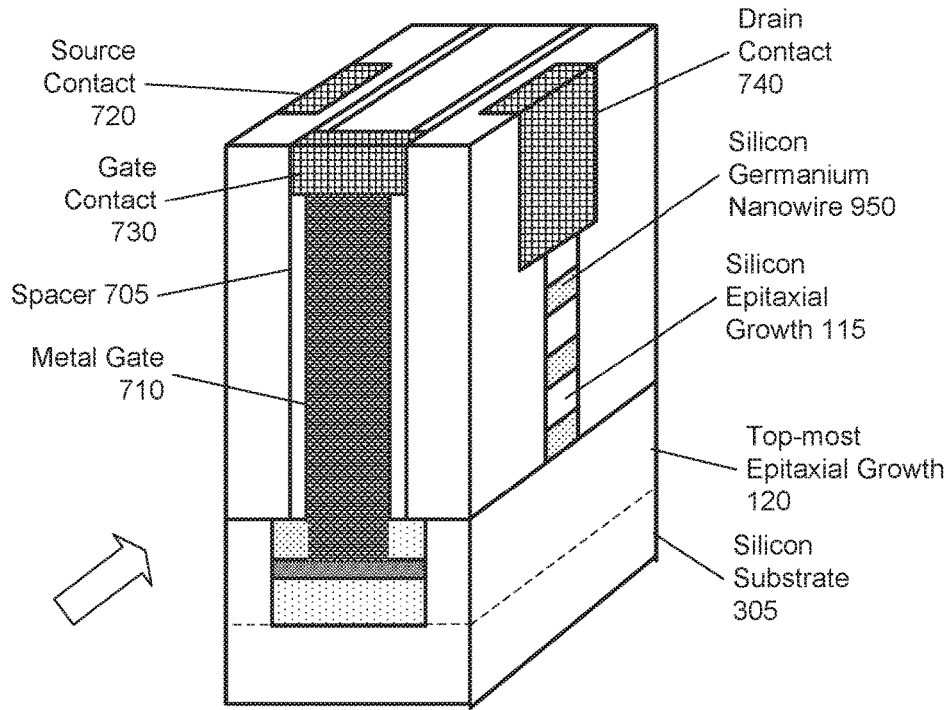
FIG. 9 is a generalized diagram of another cross-sectional view of a device being fabricated.

A generalized block diagram of another cross-sectional view of a portion of a semiconductor device being fabricated is shown in FIG. 9. In this case, the silicon germanium semiconducting layer is selected to be the nanowires, rather than the silicon semiconducting layers. Therefore, a portion of the silicon epitaxial growth layers 115 is removed from the alternating stack. The portion being removed has a length equal to at least the channel length. Similar to the cross-sectional view shown earlier in FIG. 7, contacts have been formed on the semiconductor device. A source contact 720 for the source region, a gate contact 730 and a drain contact 740 for the drain region are formed. As described earlier, between depositing the metal gate 710 and forming the contacts 720-740, the insulating layer is etched away followed by the source region and the drain region are formed by an implantation process. Afterward, another insulating layer is deposited.

The metal gate 710 is deposited throughout the gate region and around the silicon germanium nanowires 950 to provide a gate all around (GAA) semiconductor device. In addition, the metal gate 710 is deposited within the trench in the top silicon dioxide layer. In various embodiments, when the selected semiconducting layer selected to be nanowires resides on top of the trench, the top silicon dioxide layer after device flipping is etched to create space for the later deposition of the gate metal 710. In various embodiments, the silicon nitride layer is used to limit the etching of the top silicon dioxide layer after device flipping. In other embodiments, the trench does not include the silicon nitride layer, and the top silicon dioxide layer after device flipping is etched based on a timed etching process. The etch rate and the etching time are selected to create the second trench used for later depositing the gate metal 710. In this case, the silicon germanium semiconducting layer is selected to be the nanowires, rather than the silicon semiconducting layers. Following the etch of the silicon dioxide layer, a relatively thin silicon dioxide layer is grown on the silicon germanium semiconducting layers 110 to provide nanowires 950 in the gate region. A dry oxidation processing step at an elevated temperature is used to form the relatively thin oxide shell on the silicon nanowires 950. After this, a high-k dielectric, such as hafnium oxide (HfO2), can be deposited on the oxide shell on the nanowires 950 using an atomic layer deposition (ALD). The high-k dielectric may also be referred to as a high-k film.

Figure 10:
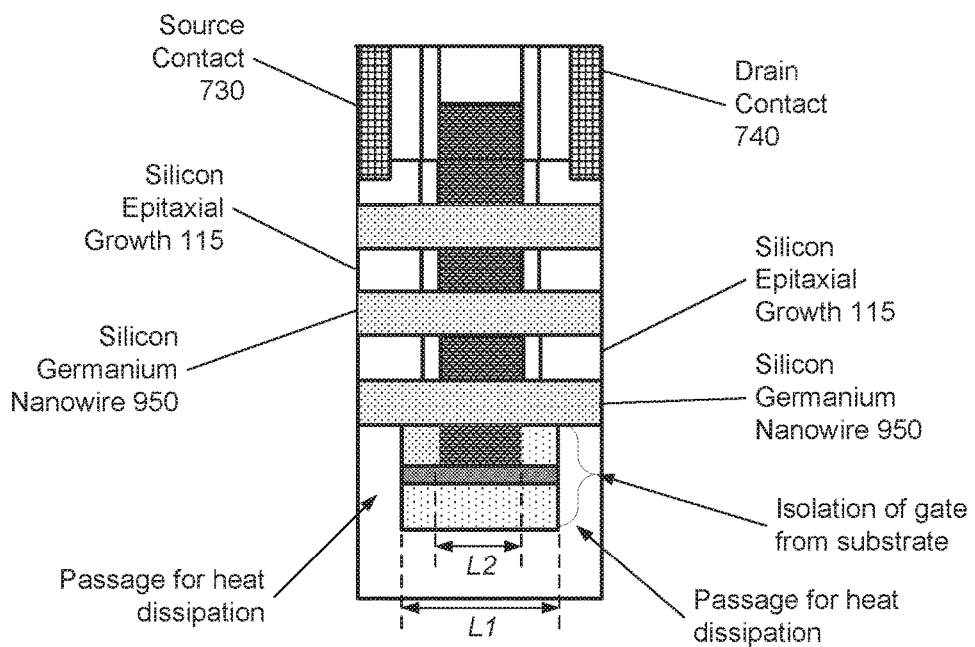
FIG. 10 is a generalized diagram of a cross-sectional view from the front of the semiconductor device being fabricated.

Turning now to FIG. 10, a generalized block diagram of a cross-sectional view from the front of the semiconductor device being fabricated is shown. As shown, the silicon germanium nanowires 950 are shown horizontally between the source region and the drain region. The metal gate is shown throughout the gate region and around the silicon germanium nanowires 950 to provide a gate all around GAA) semiconductor device.

In addition, the metal gate 710 is within the trench in the top silicon dioxide layer after device flipping. The length of the second trench etched into the silicon dioxide layer is shown as length L2. The length L2 is smaller than the length, L1, of the first trench etched into the top-most semiconducting layer 120 prior to device flipping. As described earlier, the stack of layers in the trench provides the local silicon on insulator (SOI) where the gate region is isolated from the silicon substrate 305. As the local SOI does not span the length of the semiconductor device being fabricated as is done with typical SOI, passages exist for dissipating heat generated by device operation.

Figure 11:
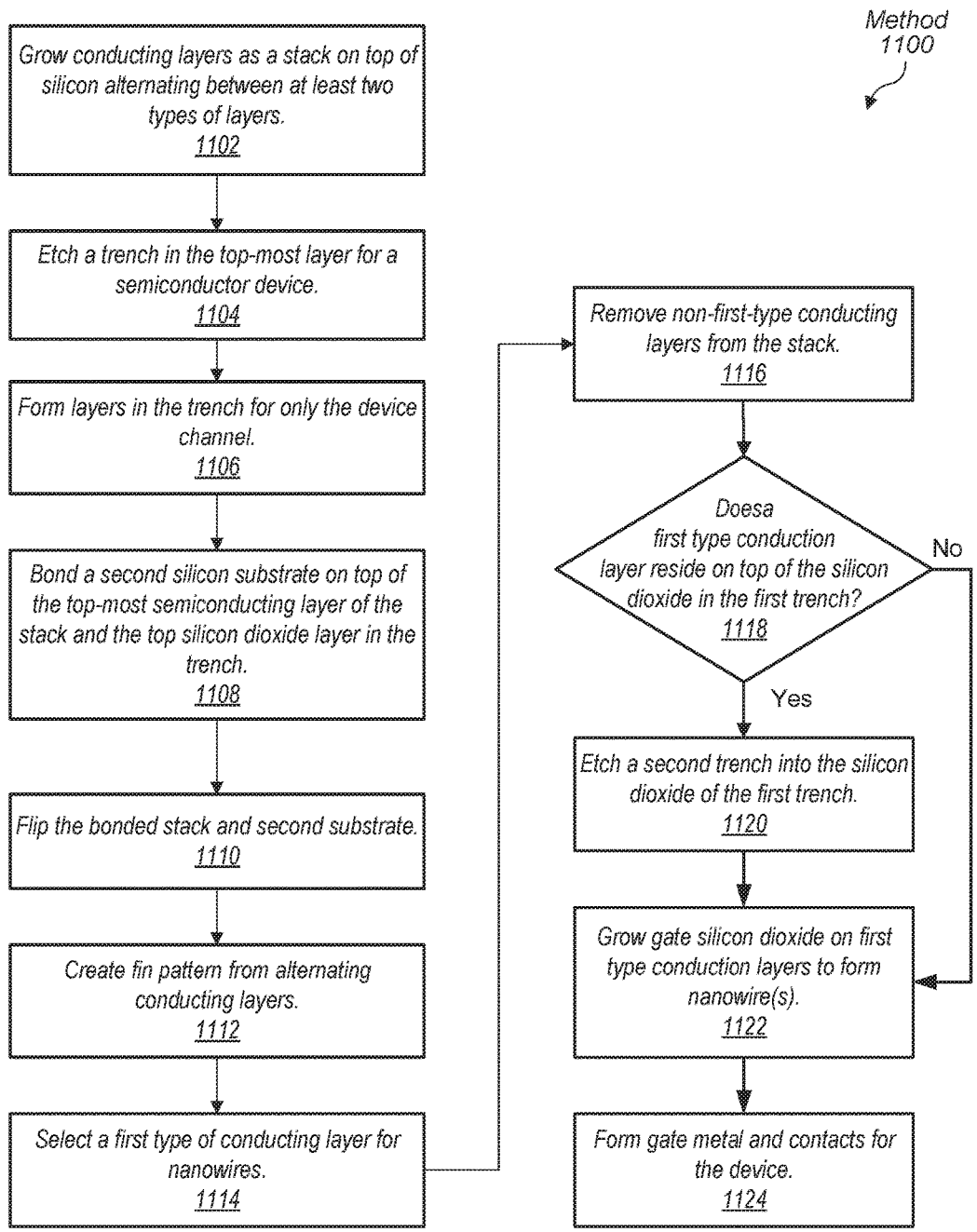
FIG. 11 is a generalized diagram of a method for forming nanowires for a non-planar semiconductor device with local silicon on insulator (SOI).

Turning now to FIG. 11, one embodiment of a method 1100 for forming nanowires for a non-planar semiconductor device with local silicon on insulator (SOI) is shown. For purposes of discussion, the steps in this embodiment are shown in sequential order. However, in other embodiments some steps occur in a different order than shown, some steps are performed concurrently, some steps are combined with other steps, and some steps are absent.

At least two types of conduction layers are grown as alternating layers in a stack on top of the silicon substrate of the wafer and the rare earth metal oxide layer (block 1102). For example, the first type of semiconducting layer, such as silicon germanium, is grown on top of the silicon substrate of the wafer. A second type of semiconducting layer, such as silicon, is grown on top of the first type of semiconducting layer. Afterward, the first type of semiconducting layer is grown on top of the second type of semiconducting layer, and the alternating growth steps repeat.

A trench is etched into the top-most semiconducting layer for a semiconductor device (block 1104). The masking material, etch rate and etching time are selected to create the trench with a length at least as long as a channel length of the semiconductor device being fabricated. The length of the trench is also bounded by a site for a source region and a site for a drain region to be added in a later fabrication step. Therefore, the length of the trench does not span the length of the semiconductor device being fabricated.

Afterward, a silicon dioxide (SiO2) layer is formed in the trench for only the device channel (block 1106). The silicon dioxide layer is formed by deposition, a chemical mechanical planarization (CMP) step used to remove unwanted silicon dioxide and to polish the remaining silicon dioxide layer on the silicon wafer, and etching to the desired thickness. Subsequently, a silicon nitride (SiNx) layer is formed on the silicon dioxide layer for only the device channel. The silicon nitride layer is formed with deposition, CMP and etching as well. At the top of the trench and on top of the silicon nitride layer, another silicon dioxide layer is formed for only the device channel. The multiple layers of silicon dioxide, silicon nitride and silicon dioxide provide an insulating layer for the non-planar semiconductor device being fabricated. In other embodiments, a silicon nitride layer is not used and the trench is only filled with silicon dioxide to provide the insulating layer for the non-planar semiconductor device being fabricated.

A second silicon substrate is bonded on top of the top-most semiconducting layer of the stack and the top silicon dioxide layer in the trench (block 1108). The bonding is performed by any of a number of wafer to wafer bonding techniques. For example, in some embodiments, copper-based wafer bonding is used. With copper as the bonding medium, an electrical bond is established as a conductive path between the wafers as well as a mechanical bond is established for holding the wafers together. In other embodiments, oxide-oxide bonding, which is also known as molecular, fusion or direct wafer bonding, is used. In various embodiments, the two bonding surfaces use the same type of semiconducting layer. For example, the second silicon substrate has a same surface as the top-most semiconducting layer of the stack, which is a silicon epitaxial growth layer. An amount of processing defects is reduced as a result when the process performs wafer bonding with two bonding surfaces using a silicon semiconducting layer for each of the two bonding surfaces. In various embodiments, there is no semiconductor processing performed on the second silicon substrate.

The device being fabricated is flipped such that the first silicon substrate and its corresponding stack are on top of the second silicon substrate (block 1110). The stack of alternating semiconductor conduction layers are now placed on top of the previously top-most semiconducting layer where the trench was etched. The trench is now upside down after the device being fabricated is flipped.

A Fin pattern is created from the alternating semiconducting layers (block 1112). Silicon Fins with a relatively small pitch but with dimensions suitable for field effect transistors are formed by directed self-assembly (DSA) patterning via chemoepitaxy or self-aligned customization. An insulating layer is deposited around the Fin pattern. The insulating layer can include silicon dioxide and silicon nitride. The insulation layer is etched to expose the alternating semiconducting layers in the gate region to be formed later.

A first type of semiconducting layer is selected for nanowires (block 1114). The first type includes one of silicon, silicon germanium, gallium arsenide (GaAs), and so forth. The first type of conduction layer is selected to remain for forming the gate region. The non-first-type semiconducting layers are removed from the stack (block 1116). If a remaining first type conduction layer resides on top of the silicon dioxide layer and the top-most semiconducting layer of the stack prior to flipping the device silicon substrate (conditional block 1118, "yes" leg), then a trench is etched into the top silicon dioxide layer (block 1120).

If a remaining first type conduction layer does not reside on top of the silicon dioxide layer and the top-most semiconducting layer of the stack prior to flipping the device silicon substrate (conditional block 1118, "no" leg), then no trench is etched into the top silicon dioxide layer. A relatively thin silicon dioxide layer is grown on the first type semiconducting layers to provide nanowires in the gate region (block 1122). Subsequently, gate metal is provided around the nanowires and within any trench in the silicon dioxide (block 1124). In addition, silicide contacts are formed at both ends of the nanowires to provide low resistive contacts for the source region and the drain region. Between depositing the metal gate and forming the contacts, the insulating layer around the ends of the nanowires is etched away followed by an implantation process for the source region and the drain region. Afterward, another insulating layer is deposited, but this time around the alternating portions of the conduction layers outside of the silicon nitride spacers.

Other cross-sectional views of a portion of a semiconductor device being fabricated are shown in FIGS. 12-16. In FIG. 12, a generalized block diagram of a cross-sectional view of a portion of a semiconductor device being fabricated is shown. Here, alternating conduction layers are grown on top of the silicon substrate 105 as shown earlier. Similar to the cross-sectional view of FIG. 2, the top-most semiconducting layer 120, which is a silicon epitaxial growth layer 115, has a trench etched into it in FIG. 13. The length of the trench, L1, is bounded by a site for a source region and a site for a drain region to be added in a later fabrication step. Therefore, the length of the trench, L1, does not span the length of the semiconductor device being fabricated. However, in contrast to the cross-sectional view of FIG. 2, the trench is further etched into the silicon germanium epitaxial layer below the top-most semiconducting layer 120.

The trench is first filled with a silicon dioxide layer 205. The first silicon dioxide layer has a thickness near the thickness of the silicon germanium epitaxial layer 110 below the top-most semiconducting layer 120. Following this, a silicon nitride layer 210 and another silicon dioxide layer 205 are formed in the trench. The multiple layers of silicon dioxide, silicon nitride and silicon dioxide provide an insulating layer for the non-planar semiconductor device being fabricated.

Turning now to FIG. 14, a generalized block diagram of another cross-sectional view of a portion of a semiconductor device being fabricated is shown. Here, a second silicon substrate 305 is bonded to the top of the silicon dioxide layer 205 and the top-most semiconducting layer 120, which is a silicon epitaxial growth layer 115, of the stack on top of the first silicon substrate 105. The bonding is performed by any of a number of wafer to wafer bonding techniques. For example, in some embodiments, copper-based wafer bonding is used. With copper as the bonding medium, an electrical bond is established as a conductive path between the wafers as well as a mechanical bond is established for holding the wafers together. In other embodiments, oxide-oxide bonding, which is also known as molecular, fusion or direct wafer bonding, is used.

In various embodiments, as described earlier, the two bonding surfaces use the same type of semiconducting layer. As shown, the second silicon substrate 305 has a surface with a silicon semiconducting layer and the top-most semiconducting layer 120 is a silicon epitaxial growth layer 115. An amount of processing defects is reduced as a result when the process performs wafer bonding with two bonding surfaces using the same type of semiconducting layer. In various embodiments, there is no semiconductor processing performed on the second silicon substrate 305. Therefore, the risk of lattice dislocations and processing defects is further reduced. Afterward, the device being fabricated is flipped such that the silicon substrate 105 and the stack are on top of the silicon substrate 305 as shown in the upcoming description.

Figure 15:
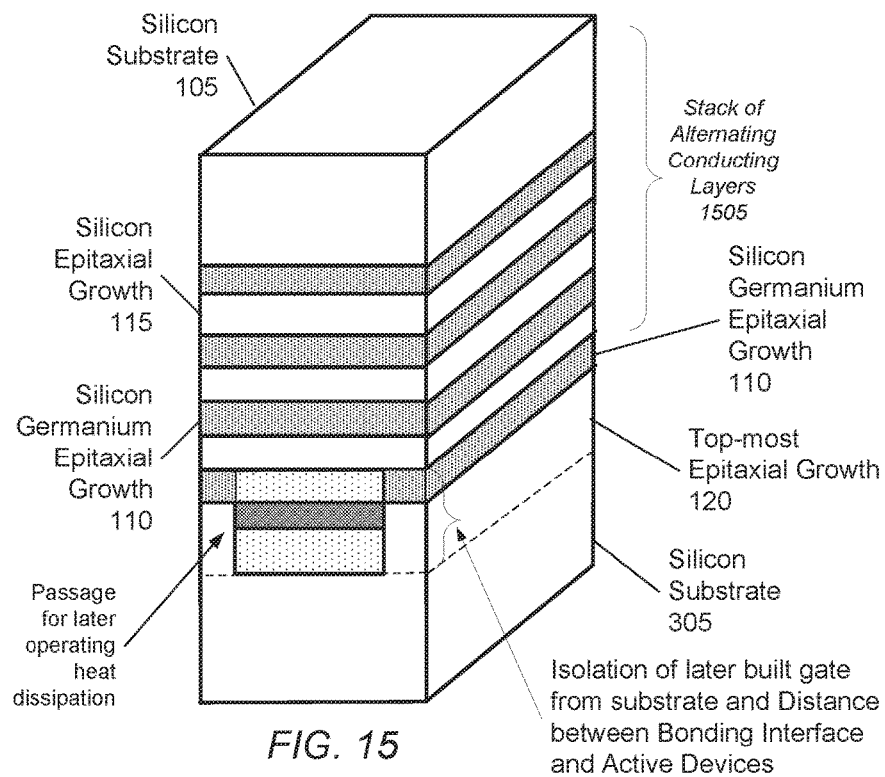
FIG. 15 is a generalized diagram of another cross-sectional view of a device being fabricated.

Turning now to FIG. 15, a generalized block diagram of another cross-sectional view of a portion of a semiconductor device being fabricated is shown. Here, the device being fabricated has been flipped such that the silicon substrate 105 and the stack are on top of the silicon substrate 305. The stack 1505 of alternating semiconductor conduction layers are shown on top of a silicon germanium epitaxial layer 110, which is now above the top-most semiconducting layer 120 after the device being fabricated has been flipped. A dashed line is used to show the bonding surface from the previous performed wafer bonding technique.

The trench is now upside down after the device being fabricated is flipped. The trench still includes a silicon dioxide layer 205, a silicon nitride layer 210 and another silicon dioxide layer 205. Now, the previously bottom silicon dioxide layer formed in the portion of the trench in the silicon germanium layer is the top layer of the trench. The sum of the thicknesses of the three layers within the trench provide the distance between the wafer bond interface shown as the dashed line and the active devices being fabricated. The increased distance reduces the associated stress and stain from the wafer bonding technique, which also decreases lattice dislocations and processing defects.

As described earlier, passageways on either side of the trench allow heat that will later be generated by an operating device to sink through the silicon germanium epitaxial layer 110, the top-most semiconducting layer 120 now below after the device being fabricated has been flipped, and the bulk silicon substrate 305 to the back surface of the wafer. In embodiments using copper-based wafer bonding, the generated heat also sinks through the copper bonding medium between the two wafers.

Figure 16:
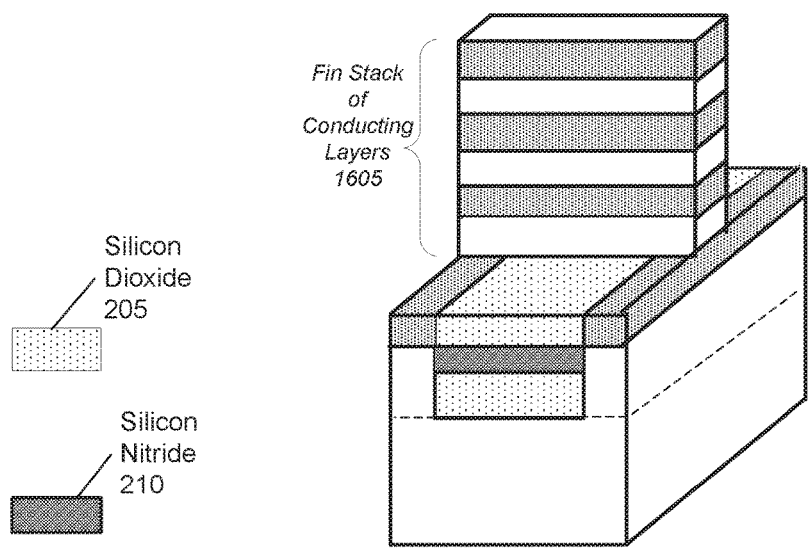
FIG. 16 is a generalized diagram of another cross-sectional view of a device being fabricated.

Referring now to FIG. 16, a generalized block diagram of another cross-sectional view of a portion of a semiconductor device being fabricated is shown. Here, a Fin stack 1605 of alternating semiconducting layers is created from the previous stack 1505 of alternating semiconducting layers. The formation of the Fin pattern is similar to the steps described earlier for FIG. 5. Once the Fin pattern 1605 is formed, the fabrication steps described earlier for FIGS. 6-10 can be used to complete the non-planar semiconductor device with local SOI.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process comprising:
    forming a stack of semiconducting layers on top of a first silicon substrate, wherein the stack comprises a plurality of semiconducting layers that alternate between at least two types of semiconducting layers;
    etching a first trench in at least a top-most semiconducting layer of the stack, wherein a width of the first trench is at least a channel length of the device;
    forming at least a first oxide layer in the first trench;
    placing a second silicon substrate on top of both the first oxide layer and the top-most semiconducting layer of the stack, wherein there is no semiconductor processing performed on the second silicon substrate;
    flipping the device such that the first silicon substrate and the stack are on top of the second silicon substrate;
    creating a fin pattern from the stack;
    removing a portion of semiconducting layers of any type other than a first type from the stack, wherein semiconducting layers of the first type form nanowires in a gate region of the device; and
    forming a silicon layer, a silicon dioxide layer and a high-k film on the nanowires in the gate region.

2. The semiconductor device fabrication process as recited in claim 1, wherein forming the stack comprises growing the plurality of semiconducting layers to form a completed stack on the first silicon substrate prior to placing the second silicon substrate.

3. The semiconductor device fabrication process as recited in claim 1, wherein the top-most semiconducting layer of the stack comprises silicon.

4. The semiconductor device fabrication process as recited in claim 1, wherein placing the second silicon substrate comprises bonding the second silicon substrate to the top of both the first oxide layer and the top-most semiconducting layer of the stack.

5. The semiconductor device fabrication process as recited in claim 4, wherein a distance between the stack of semiconducting layers and a bonding interface of the second silicon substrate comprises the first trench.

6. The semiconductor device fabrication process as recited in claim 4, wherein the process further comprises foregoing further fabrication processing on the second silicon substrate after said bonding.

7. The semiconductor device fabrication process as recited in claim 1, wherein prior to forming the first oxide layer, the process further comprises:
    forming a second oxide layer on the first silicon substrate in the first trench; and
    forming a nitride layer on the second oxide layer in the first trench, wherein the nitride layer is between the first oxide layer and the second oxide layer in the first trench.

8. The semiconductor device fabrication process as recited in claim 7, wherein the first trench is etched into a silicon germanium layer below the top-most semiconducting layer, wherein the second oxide layer is formed at the silicon germanium layer and each of the nitride layer and the first oxide layer are formed at the top-most semiconducting layer.

9. The semiconductor device fabrication process as recited in claim 1, wherein the first type of semiconducting layer comprises one of silicon and silicon germanium.

10. The semiconductor device fabrication process as recited in claim 1, wherein when one or more nanowires are residing on top of the first oxide layer, the process further comprises:
    etching a second trench into the first oxide layer; and
    depositing gate metal in the second trench for the one or more nanowires.

11. A non-transitory computer readable storage medium storing program instructions, wherein the program instructions for performing a semiconductor process are executable by a processor to:
    form a stack of semiconducting layers on top of a first silicon substrate, wherein the stack comprises a plurality of semiconducting layers that alternate between at least two types of semiconducting layers;
    etch a first trench in at least a top-most semiconducting layer of the stack, wherein a width of the first trench is at least a channel length of the device;
    form at least a first oxide layer in the first trench;
    place a second silicon substrate on top of both the first oxide layer and the top-most semiconducting layer of the stack, wherein there is no semiconductor processing performed on the second substrate;
    flip the device such that the first silicon substrate and the stack are on top of the second silicon substrate;
    create a fin pattern from the stack;
    remove a portion of semiconducting layers of any type other than a first type from the stack, wherein semiconducting layers of the first type form nanowires in a gate region of the device; and
    form a silicon layer, a silicon dioxide layer and a high-k film on the nanowires in the gate region.

12. The non-transitory computer readable storage medium as recited in claim 11, wherein to form the stack, the program instructions are further executable by a processor to grow the plurality of semiconducting layers to form a completed stack on the first silicon substrate prior to placing the second silicon substrate.

13. The non-transitory computer readable storage medium as recited in claim 12, wherein the top-most semiconducting layer of the stack comprises silicon.

14. The non-transitory computer readable storage medium as recited in claim 13, wherein to place the second silicon substrate, the program instructions are further executable by a processor to bond the second silicon substrate to the top of both the first oxide layer and the top-most semiconducting layer of the stack.

15. The non-transitory computer readable storage medium as recited in claim 14, wherein a distance between the stack of semiconducting layers and the bonding interface comprises the first trench.

16. The non-transitory computer readable storage medium as recited in claim 14, wherein the program instructions are further executable by a processor to forego further fabrication processing on the second silicon substrate after said bonding.

* * * * *